US009184625B1

(12) United States Patent
Sauvage et al.

(10) Patent No.: US 9,184,625 B1
(45) Date of Patent: Nov. 10, 2015

(54) SYSTEM AND METHOD FOR SOLAR KEYBOARD POWER MANAGEMENT

(75) Inventors: Sylvain Sauvage, La Tour-de-Peilz (CH); Jacques Robert, Le Mont-sur-Lausanne (CH); Olivier Bodenmann, Echallens (CH)

(73) Assignee: Logitech Europe S.A., Lausanne (CH)

( * ) Notice: Subject to any disclaimer, the term of this patent is extended or adjusted under 35 U.S.C. 154(b) by 1027 days.

(21) Appl. No.: 13/284,318

(22) Filed: Oct. 28, 2011

(51) Int. Cl.
*H01M 10/44* (2006.01)
*H01M 10/46* (2006.01)
*H02J 7/35* (2006.01)
*H02J 3/38* (2006.01)

(52) U.S. Cl.
CPC .. *H02J 7/35* (2013.01); *H02J 3/383* (2013.01)

(58) Field of Classification Search
CPC .......................................................... H02J 7/35
USPC .......................................................... 320/101
See application file for complete search history.

(56) References Cited

U.S. PATENT DOCUMENTS

| 7,536,574 | B2 | 5/2009 | Liu | |
| 7,934,107 | B2 | 4/2011 | Walrath | |
| 8,407,500 | B2* | 3/2013 | Lee | 713/320 |
| 8,427,098 | B2* | 4/2013 | Moore et al. | 320/103 |
| 2008/0133956 | A1* | 6/2008 | Fadell | 713/340 |
| 2011/0151943 | A1* | 6/2011 | Lee | 455/573 |
| 2011/0169444 | A1* | 7/2011 | Wang | 320/101 |

OTHER PUBLICATIONS

U.S. Appl. No. 13/284,329, filed Oct. 28, 2011, Sauvage et al.
Press Release, "If You've Got Light, You've Got Power: Logitech Introduces Solar-Powered Keyboard," Nov. 1, 2010, Fremont, CA, 2 pages.
CNET Archive, Cherry CyMotion Master Solar M86-21950, CNET Reviews, retrieved on Nov. 8, 2011 from the Internet URL <http://reviews.cnet.com/keyboards/cherry-cymotion-master-solar/1707-3134_7-31095269.html>, 1 page.
"Solar Power Keyboard," G24 Innovations, retrieved on Nov. 8, 2011 from the Internet URL <http://www.g24i.com/pages,solar-powered-keyboard,93.html>, 1 page.
12-Digit LCD Calculator, Compucessory, retrieved on Nov. 8, 2011 from the Internet URL <http://www.amazon.com/Compucessory-12-Digit-LCD-Calculator/dp/B000V7UTHQ/ref=sr_1_1?ie=UTF8&qid=1309374179&sr=8-1>, 4 pages.

(Continued)

*Primary Examiner* — Edward Tso
*Assistant Examiner* — Ahmed Omar
(74) *Attorney, Agent, or Firm* — Kilpatrick Townsend & Stockton LLP

(57) ABSTRACT

A method for determining a power sustainability status of a device having one or more solar panels and a battery includes receiving a request to indicate the power sustainability status, measuring a voltage of the battery, and determining a usage level of the device and a low power sustainability threshold. The method further includes computing a remaining capacity of the battery using the voltage of the battery and usage level of the device and computing a light exposure level associated with the one or more solar panels. Additionally, the method includes determining a power sustainability index using at least one of the remaining capacity of the battery or the light exposure level and comparing the power sustainability index to the low power sustainability threshold.

13 Claims, 10 Drawing Sheets

(56) References Cited

OTHER PUBLICATIONS

SlimStar 820 Solargizer, Genius, retrieved on Nov. 8, 2011 from the Internet URL <http://www.geniusnet.com/geniusOnline/upload/support/eCatalogue/k_m/SlimStar820.pdf>, 4 pages.

Office Action for U.S. Appl. No. 13/284,329 (Sep. 3, 2013) 9 pages.
Final Office Action for U.S. Appl. No. 13/284,329 (Dec. 4, 2013) 8 pages.
Notice of Allowance for U.S. Appl. No. 13/284,329 (Apr. 21, 2014) 5 pages.

* cited by examiner

SYSTEM AND METHOD FOR SOLAR KEYBOARD POWER MANAGEMENT

CROSS-REFERENCES TO RELATED APPLICATIONS

This application is related to commonly owned and concurrently filed U.S. patent application Ser. No. 13/284,329, entitled "Computer-implemented Keyboard Power Management System," the entire contents of which are herein incorporated by reference for all purposes.

BACKGROUND OF THE INVENTION

Solar-powered electronic devices are currently available for purchase and use. An example of such a device is a solar-powered calculator. Some solar-powered calculators do not have a battery for providing an alternate source of power in the absence of light. As a result, if the light is not sufficient, these solar-powered calculators may not work.

Despite the progress made in solar-powered electronic devices, there is a need in the art for improved methods and systems related to these solar-powered electronic devices.

SUMMARY OF THE INVENTION

The present invention relates generally to power management for a solar powered device. More particularly, the present invention relates to providing power consumption and re-charging information for a solar-powered device. Merely by way of example, a wireless solar-powered keyboard utilizing one or more solar panels is provided. In an embodiment, the keyboard communicates with a computer over a wireless connection and utilizes the one or more solar panels as an energy source.

According to an embodiment of the present invention, a method of determining a power sustainability status of a device having one or more solar panels and a battery is provided. The method includes receiving a request to indicate the power sustainability status, measuring a voltage of the battery, determining a usage level of the device and a low power sustainability threshold, and computing a remaining capacity of the battery using the voltage of the battery and usage level of the device. The method also includes computing a light exposure level associated with the one or more solar panels, determining a power sustainability index using at least one of the remaining capacity of the battery or the light exposure level, and comparing the power sustainability index to the low power sustainability threshold.

According to another embodiment of the present invention, a method of indicating a power sustainability status of a device having a processor, a timer, one or more solar panels, and a battery, is provided. The method includes generating, using the timer, a trigger at a particular time interval. In response to at least the trigger, the method also includes measuring a voltage of the battery, computing, in the processor, a remaining capacity of the battery using the voltage of the battery, and computing, in the processor, a light exposure level associated with the one or more solar panels. The method also includes determining a power sustainability index using at least one of the remaining capacity of the battery or the light exposure level, determining the power sustainability status based on the power sustainability index, and providing an indication of low power sustainability status.

According to another embodiment of the present invention, a solar keyboard is provided that includes a housing, a keystroke input module disposed in the housing and operable to provide character data to a processor device, and a battery disposed in the housing. The solar keyboard also includes one or more solar panels disposed on the housing, a power sustainability computation module, a power status input device, and a power status indicator unit.

According to another embodiment of the present invention, a method for displaying power sustainability data for a battery is provided. The method includes providing a processor and a memory device coupled to the processor, receiving power sustainability data at a plurality of times, the power sustainability data comprising a remaining battery capacity and a light exposure level. The method further includes storing data values in the memory device, the data values associated with the power sustainability data and the plurality of times. Additionally, the method includes obtaining most recently received data values for remaining battery capacity and light exposure level and displaying the most recently received data values for remaining battery capacity and light exposure levels.

According to another embodiment of the present invention, a non-transitory computer-readable storage medium is provided that includes instructions to provide a message on a display device. The instructions include instructions that cause the data processor to receive power sustainability data at a plurality of times, the power sustainability data comprising a remaining battery capacity and a light exposure level. In addition, instructions are included that cause the data processor to store data values in the memory device, the data values associated with the power sustainability data and the plurality of times and instructions that cause the data processor to display the most recently received data values for remaining battery capacity and light exposure levels.

According to another embodiment of the present invention, a solar keyboard power management system is provided that includes a solar keyboard operable to provide character data to a processor device. The solar keyboard includes a keystroke input module, a battery, and one or more solar panels electrically coupled to the battery. In addition, the solar keyboard power management system includes a graphical user interface operable to provide power sustainability data on a display device. The graphical user interface includes a light level indicator pane, a battery information pane, and a status message pane.

According to an embodiment of the present invention, a solar keyboard power management system is provided that includes the ability to provide information to the keyboard user regarding the power sustainability status of the keyboard A minimal amount of power is required to determine and provide the status. The power sustainability status is based on the remaining capacity of the battery and the light exposure level to the solar panels. Periodically, and additionally upon request, a keyboard processor determines the remaining capacity of the battery and the light exposure level to the solar panels. Based on this data, the keyboard processor determines the power sustainability status of the keyboard. When the status is determined upon request, the status is provided by flashing an LED associated with the resulting status. When the status is determined periodically, only a status that warrants warning the user is provided.

According to another embodiment of the present invention, a solar keyboard power management system is provided that includes the ability to provide information to the keyboard user regarding the power sustainability status of the keyboard. Along with the character data that the keyboard provides to a computer, the keyboard may also send keyboard power-related data. A power management application running on the computer may timestamp and store the power-related data for later retrieval. The application may use the computer display to present a user interface that includes current keyboard power status information, historical trends of battery capacity and light exposure, and a message describing the current power status and advice. Having the computer analyze and display the data allows for presenting more useful and detailed information than the keyboard itself could provide, and the application may be powered by the computer's power source without further draining the keyboard power that is being monitored.

According to an embodiment of the present invention, a solar computer keyboard powered by solar energy is provided. The solar computer keyboard includes a battery for storing energy and is operable to operate indoors and/or in dark or dim conditions for some period of time. As described throughout the present specification, monitoring of the battery capacity and the light exposure is provided as part of a power management capability for the solar computer keyboard. Such monitoring may include determining when the energy levels should be measured, and when and how to notify the user that the energy levels are too low. Embodiments of the present invention reduce or minimize the energy used for measuring, determining, and notifying a user in comparison with conventional techniques.

Numerous benefits are achieved by way of the present invention over conventional techniques. For example, embodiments of the present invention provide very low power techniques to monitor and provide proactive feedback to the user regarding power levels of the keyboard to avoid the keyboard becoming inoperable due to a drained battery. Additionally, embodiments provide a dedicated "CheckLight" button on the keyboard that provides a positive or negative indication related to the keyboard energy balance between incoming light and battery remaining capacity. As described below, pressing the CheckLight button may trigger a power management application running on the computer to display current remaining battery capacity and light exposure levels as well as historical trends for remaining battery capacity and light exposure levels. These and other embodiments of the invention, along with many of its advantages and features, are described in more detail in conjunction with the text below and attached figures.

DETAILED DESCRIPTION OF SPECIFIC EMBODIMENTS

Embodiments of the present invention relate to power management methods and systems for a solar powered device. More particularly, the present invention relates to providing power consumption and re-charging information for a solar-powered device. Merely by way of example, a wireless solar-powered keyboard utilizing one or more solar panels is provided. In an embodiment, the keyboard communicates with a computer over a wireless connection and utilizes the solar panels as an energy source.

As described more fully throughout the present specification, according to an embodiment of the present invention, the solar keyboard management system monitors the remaining battery capacity, determines whether current use of the keyboard is sustainable considering the amount of light to which the solar panels are exposed, and provides an indication of the power sustainability status to a user so that if power is not sustainable for current use, the keyboard may be placed or oriented differently to provide sufficient light. Power sustainability status may indicate the extent to which continued use of the keyboard under present light conditions may be sustained over time.

Figure 1:
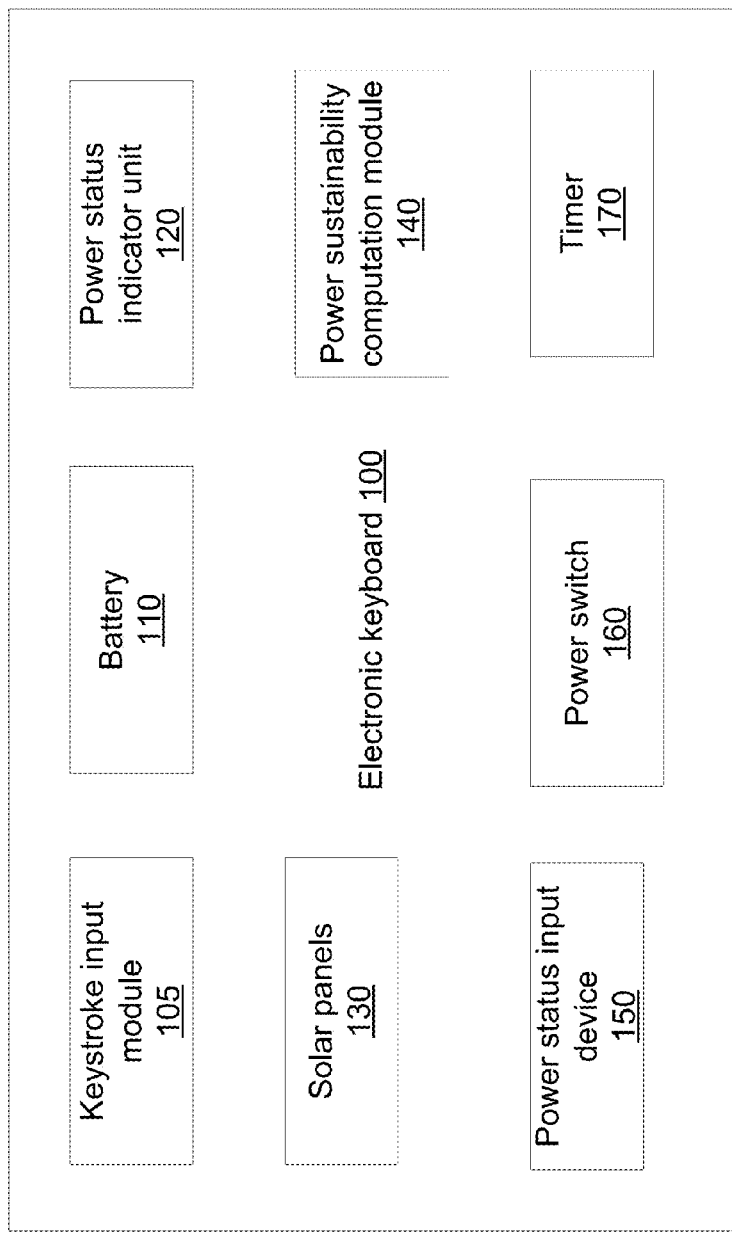
FIG. 1 is a simplified schematic diagram illustrating components of a solar keyboard power management system according to an embodiment of the present invention.
Figure 1:
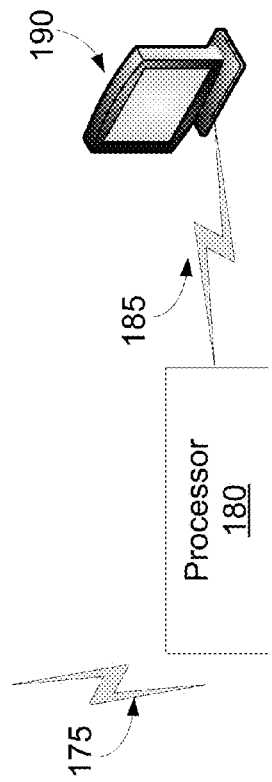

FIG. 1 is a simplified schematic diagram illustrating components of a solar keyboard power management system according to an embodiment of the present invention. Electronic keyboard 100 connects to processor 180 over communications link 175, and processor 180 is connected to a display 190 over communications link 185. Communications link 175 may be a wireless network connection. The wireless connection may be Bluetooth or any other standard or proprietary wireless network protocol. Communications link 185 may be a wired connection and may be a network or a direct connection between processor 180 and display 190.

The electronic keyboard includes a housing 900 (see FIG. 9) including keystroke input module 105, which includes a plurality of keystroke input elements or devices and is operable to receive input in response to an alphanumeric key, or other suitable input element or device such as a media control button, being pressed on the keyboard. The keystroke input module 105 generates character data associated with the pressed key and sends the character data to processor 180 over communication link 175. Receipt of the character data by processor 180 may affect the content that the processor 180 sends to display 190 over communication link 185.

Solar panels 130 are coupled to the housing, for example, disposed on an upper surface of the housing and convert light energy into electrical energy for powering electronic keyboard 100 and recharging battery 110. In one embodiment, all the power from the solar panels 130 goes to charging battery 110, and battery 110 is used to power the keyboard. In an alternate embodiment, solar panels 130 provide power directly to the keyboard 100 when the keyboard is in use, and any surplus power is used to recharge battery 110. Thus, depending on the embodiment, the light levels may be measured, the current available from the solar panels may be computed, the energy used by the keyboard may be computed, and the various values can be displayed to provide a real time or averaged summary of the power available from the solar panels and the battery as well as the power consumption by the keyboard. These values may be based on real-time data or based on data collected over one or more predetermined periods (e.g., minutes, hours, days, week, months, years, or the like).

In an embodiment, the solar keyboard is only charged through the solar panels, lacking any other source of charging the battery or providing power to the keyboard. For example, the keyboard may lack an electrical adapter for receiving power from a wall socket, a USB power source, or other AC or DC power source. In an alternative embodiment, the solar keyboard can utilize other energy sources in addition to the solar panels, for example, a USB cable, a DC power source, or the like and/or may receive electrical power from a plurality of sources.

Power switch 160 is an on/off switch. In one embodiment, while the keyboard is turned off, no energy is being consumed from the battery; however, the solar panels are operable to recharge the battery. In an alternate embodiment, while the keyboard is turned off, the keyboard is not operable as a keystroke input device; however, power monitoring and management functions may consume energy from the battery. In an embodiment, when the switch is moved from the "off" position to the "on" position, the keyboard checks the battery capacity and flashes a red LED if the current remaining battery capacity is below a low power sustainability threshold and flashes a green LED if the current battery level is sufficient. In an embodiment, the low power sustainability threshold may be 40% of remaining battery capacity. As described more fully below, this red LED and this green LED can be components of power status indicator unit 120, discussed in additional detail below.

Figure 2:
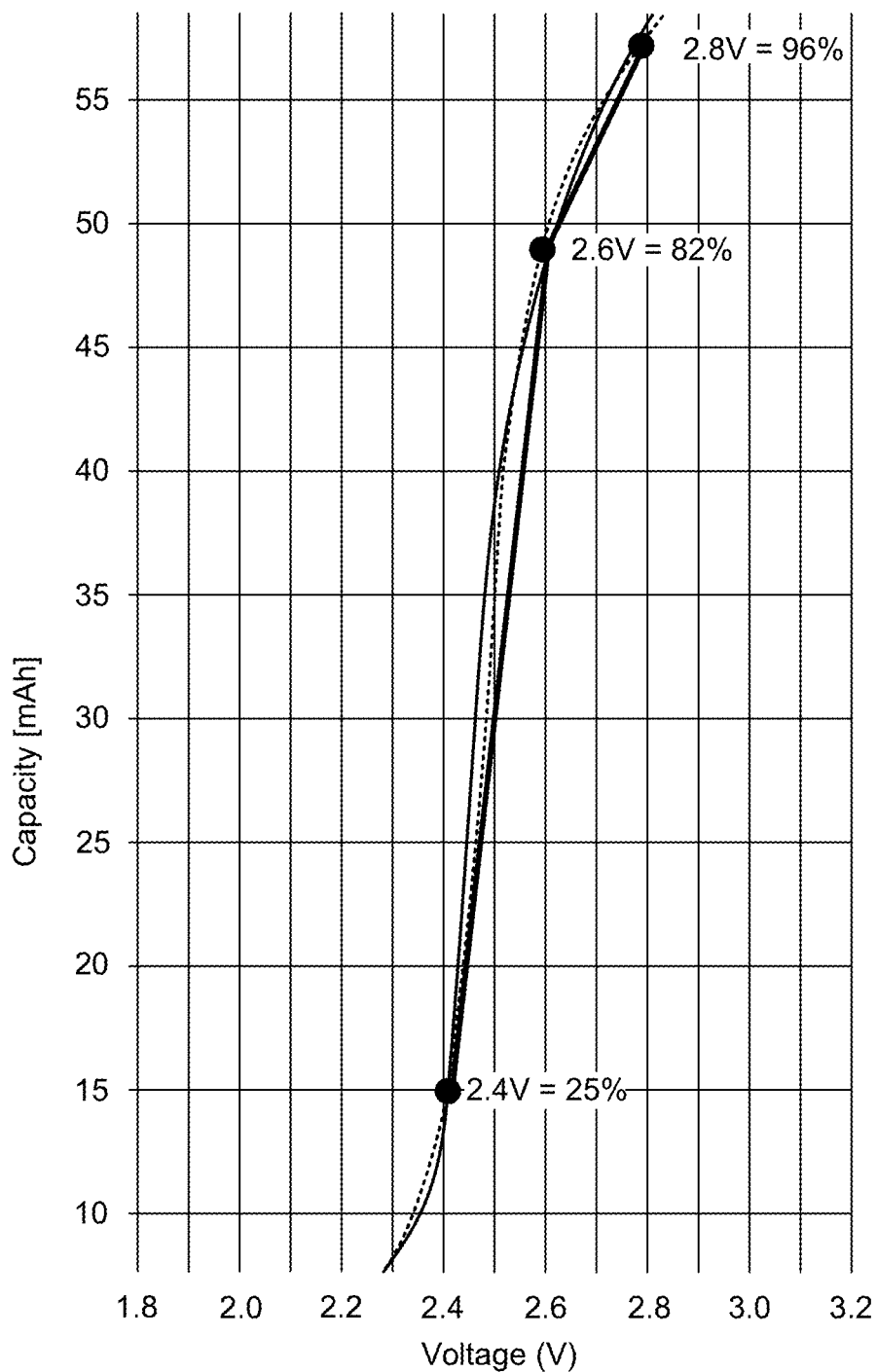
FIG. 2 is a graph of remaining battery capacity as a function of battery voltage according to an embodiment of the present invention.

Power sustainability computation module 140 monitors the power system and determines power sustainability for the keyboard. Once triggered, power sustainability computation module 140 measures the voltage of battery 110, and determines an amount of remaining battery capacity. A microcontroller may be included in power sustainability computation module 140 to monitor battery voltage and compute remaining capacity. For example, FIG. 2 is a graph of remaining battery capacity as a function of battery voltage according to an embodiment of the present invention. The graph illustrates a function that converts measured battery voltage to remaining battery capacity based on the typical discharge curve for the particular type of battery used in the keyboard (different battery types may have different discharge curves). In an embodiment, the amount of remaining battery capacity may be determined in milliampere-hours (mAh) and mapped to a percentage of the total battery capacity. For example, according to FIG. 2, a battery with a measured voltage of 2.8V has approximately 96% of capacity remaining; a battery measured voltage of 2.6V has approximately 82% capacity remaining, and a battery with a measured voltage of 2.4V has approximately 25% capacity remaining To allow displaying the maximum and minimum values of 100% and 0%, the scale is shrunk so that 2.8V will display 100% and 2.4V will display 0%. The slope of the curve in the example is very steep; that is, a very small change in the measured voltage may result in a very different value for remaining battery capacity. For at least that reason, embodiments of the present invention provide methods and a system to provide accurate voltage measurement, and/or to average several independent voltage measurements and use the average voltage as input to the remaining battery capacity function. Alternatively, each independent voltage measurement may be input into the remaining battery capacity function, and the plurality of remaining battery capacity outputs may be averaged together, and the average battery capacity may be used to determine power sustainability.

The power sustainability computation module 140 may also determine the amount of light being received by the solar panels. In an embodiment, the power sustainability computation module 140 may measure the current generated by the solar panels as an indication of the amount of light being received. Based on the remaining battery capacity and the amount of light being received by the solar panels, power sustainability computation module 140 may determine power sustainability. Low power sustainability may indicate the need to expose electronic keyboard 100 to more light. Power sustainability may also be determined using an expected average use of the keyboard. In an embodiment, a constant representing the average number of keystrokes per year may be used as input to determine the power sustainability. In an alternate embodiment, the inclusion of a real-time clock may allow for dynamic usage statistics for the keyboard to be collected and used as input into the power sustainability index.

Preferably, the battery is operated near 100% capacity to provide reliable long term operation. Cycling of the battery is allowed, even over a long term (e.g., a year), to provide for reliable operation in high latitude environments in which the battery can slowly charge over the summer in the northern latitudes and slowly discharge over the winter. Table 1 is a chart showing remaining battery capacity and minimum light exposure levels needed to sustain power, according to an embodiment of the invention. The numbers in the table have been derived assuming a constant expected usage, although other usage levels other than constant usage can be utilized according to embodiments of the present invention. As described below, the usage level can be dynamic, measured over a predetermined time period, or the like. One of ordinary skill in the art would recognize many variations, modifications, and alternatives.

The greater the remaining battery capacity, the lower the required light exposure level needed to sustain power. For example, when the remaining battery capacity is between 90%-100%, power to the keyboard may be sustained with a minimum light exposure level of 50 lux. When the remaining battery capacity is between 60%-90%, power to the keyboard may be sustained with a minimum light exposure level of 100 lux. when the remaining battery capacity is between 30%-60%, power to the keyboard may be sustained with a minimum light exposure level of 150 lux. When the remaining battery capacity is between 0% and 30%, the minimum light exposure level is 200 lux to sustain power. When the remaining battery capacity is 0%, the keyboard may stop functioning unless and until a light exposure level of 300 lux is provided to the solar panels. A remaining battery capacity of 0% may not mean that there is no charge left in the battery, since at 0% capacity there may still be a reserve of battery capacity remaining (e.g., 10% of the battery capacity), enabling operation even at low battery capacities. Other reserve values can be utilized and a 10% reserve value is merely provided by way of example.

TABLE 1

Minimum light exposure level based on remaining battery capacity

| Remaining battery capacity (% of battery capacity) | Minimum light exposure level to sustain power (lux) |
| --- | --- |
| 90-100 | 50 |
| 60-90 | 100 |
| 30-60 | 150 |
| >0-30 | 200 |
| 0 | 300 |

In an embodiment, power sustainability may be determined by performing several steps. First, the remaining battery capacity may be used to determine the required light exposure level. In an embodiment, the expected usage may be a constant that is used in constructing a table such as Table 1 that provides an association between remaining battery capacity and required light exposure level for sustainability. Alternatively, a required light exposure level function may take remaining battery capacity and dynamically-determined expected usage as inputs and output the required light exposure level. Regardless of how the required light exposure level may be determined, the next step is to compare the present light exposure level to the required light exposure level. If the present light exposure level is greater than or equal to the required light exposure level, then the power sustainability may be sufficient. If the present light exposure level is less than the required light exposure level, then the power sustainability may be low. If the remaining battery capacity is 0% and the light exposure level is less than 300 lux, then the power sustainability status may be critically low.

Although Table 1 illustrates the minimum light exposure level needed to sustain current use, which is determined based on remaining battery capacity, other minimum light exposure levels can be associated with the remaining battery capacity. Thus, the numbers and ranges provided in Table 1 are not absolute, but are provided as exemplary numbers and ranges for the illustrated embodiment. Different hardware (e.g., solar cells and batteries) with different features will utilize different amounts of power depending on the particular implementation. Additionally, different ranges of remaining battery capacity can be associated with different light exposure levels and different current/voltage characteristics of the solar panels. Thus, embodiments of the present invention provide a dynamic system in which the different desired solar power levels are utilized based on different levels of battery charge.

In another embodiment of the invention, a power sustainability function may take the remaining battery capacity and light exposure level as inputs and output a power sustainability index. If the expected usage is a constant, the power sustainability function may be derived based on the expected usage constant. Alternatively, the expected usage may be an input to the function, and the expected usage may be a constant or may be determined dynamically for the particular keyboard based on past use. The expected usage may be determined by logging the number of keystrokes per unit time, and averaging these values over a longer period of time. For example, the number of keystrokes per minute may be logged, and a running average of keystrokes per minute may be computed over any time period such as an hour, day, week, month, or year. The power sustainability index that is output by the power sustainability function may be compared with a low power sustainability threshold. If the index is greater than the low power sustainability threshold, then the current usage is determined to be sustainable under the current lighting conditions (sufficient power sustainability). If the power sustainability index is less than or equal to the low power sustainability threshold, then the current usage is determined not to be sustainable under the current lighting conditions (low power sustainability). In addition, the power sustainability index may be compared to a critical low threshold, and if the index is less than or equal to the critical low threshold, the keyboard may soon be disabled (critically low sustainability).

Power sustainability computation module 140 may be triggered into operation in a variety of ways. In an embodiment, transitioning power switch 160 from an "off" position to an "on" position may cause power sustainability computation module 140 to determine a power sustainability status based on the present remaining battery capacity and indicate the status through power status indicator unit 120. Power switch 160 may be any kind of power switch with an on and off position that is known in the art, such as a slider, a toggle button, or the like.

In another embodiment, power sustainability computation module 140 may be triggered by power status input device 150. Power status input device is a device or element that a user can activate when the keyboard is already in use to obtain an updated power sustainability status. In an embodiment, power status input device 150 may be a "Check Light" button on electronic keyboard 100, which when pressed, causes power sustainability computation module 140 to determine power sustainability.

Figure 9:
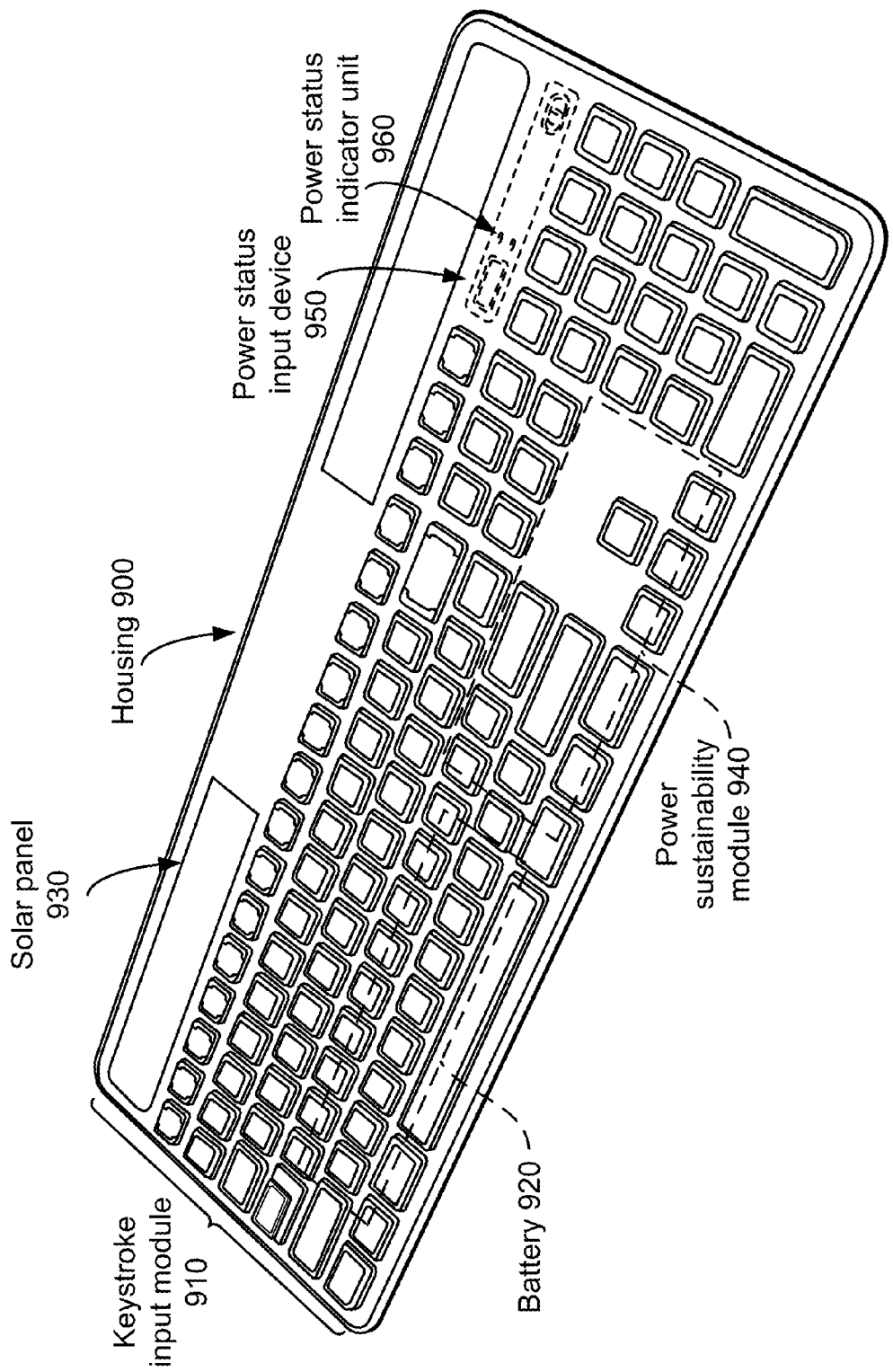
FIG. 9 is a simplified diagram of a solar keyboard according to an embodiment of the present invention.

FIG. 9 is a simplified diagram of a solar keyboard according to an embodiment of the present invention. The solar keyboard includes a housing 900, a keystroke input module 910 disposed in the housing and operable to provide character data to a processor device, and a battery 920 disposed in the housing. The solar keyboard further includes one or more solar panels 930 disposed on the housing, and a power sustainability computation module 940. The solar keyboard also includes a power status input device 950 and a power status indicator unit 960. The dashed lines corresponding to battery 920 and power sustainability computation module 940 indicate that these components are inside the keyboard, and may not be visible from the outside.

Figure 3:
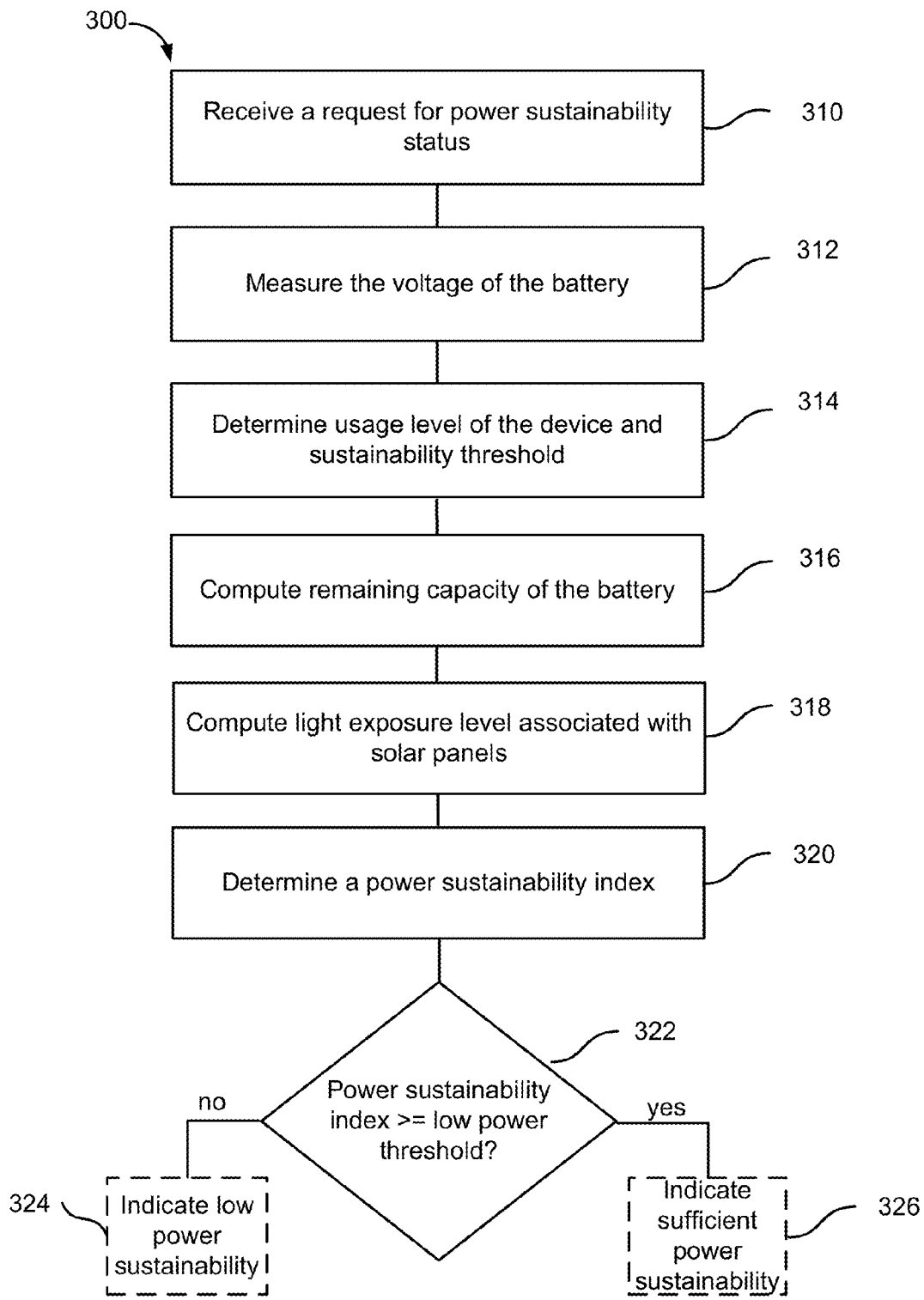
FIG. 3 is a simplified flowchart illustrating a method of determining a power sustainability status according to an embodiment of the present invention.

FIG. 3 is a simplified flowchart illustrating a method of determining a power sustainability status according to an embodiment of the present invention. The method includes receiving a request for power sustainability status (310), for example, in response to pressing a Check Light button on the keyboard. The method also includes measuring the battery voltage (312) and determining a usage level and a low power sustainability threshold (314). The usage level may be an expected usage level based on historical data for a particular user, a constant value stored in a memory, a value dependent on a recent time period, or the like.

The method further includes computing a remaining capacity of the battery (316) using the voltage of the battery and usage level of the device and computing a light exposure level associated with the one or more solar panels (318). In addition, the method includes determining a power sustainability index (320) using at least one of the remaining capacity of the battery or the light exposure level and comparing the power sustainability index to the low power sustainability threshold (322), and providing an optional indication of the power sustainability status of the device. As examples, if the power sustainability index is greater than or equal to a low power sustainability threshold, then an indication of sufficient power sustainability is provided (326), meaning that the current light exposure is sufficient for powering the keyboard at the expected usage with the remaining battery capacity. The low power sustainability threshold is an index value below which the keyboard cannot sustain power at the current light exposure levels. If the power sustainability index is less than the low power sustainability threshold, then an indication of low power sustainability is provided (324), meaning that more light exposure will be necessary to sustain the expected usage of the keyboard with the current remaining battery capacity. As will be evident to one of skill in the art, the sufficiency of battery capacity and light exposure levels will depend on the keyboard use, which may vary as a function of time. Since power consumption varies depending on usage, the indication is a snapshot in time based on the available data including current and/or historical usage and current and/or historical light intensity.

It should be appreciated that the specific steps illustrated in FIG. 3 provide a particular method of providing an indication of power sustainability status according to an embodiment of the present invention. Other sequences of steps may also be performed according to alternative embodiments. For example, alternative embodiments of the present invention may perform the steps outlined above in a different order. Moreover, the individual steps illustrated in FIG. 3 may include multiple sub-steps that may be performed in various sequences as appropriate to the individual step. Furthermore, additional steps may be added or removed depending on the particular applications. One of ordinary skill in the art would recognize many variations, modifications, and alternatives.

In yet another embodiment, power sustainability computation module 140 may be triggered by timer 170. Timer 170 may be configured to trigger power sustainability computation module 140 at a periodic time interval, for example, every 90 seconds. The keyboard power system may be monitored continuously while the keyboard is in use, even when the user does not explicitly request a status report.

Figure 4:
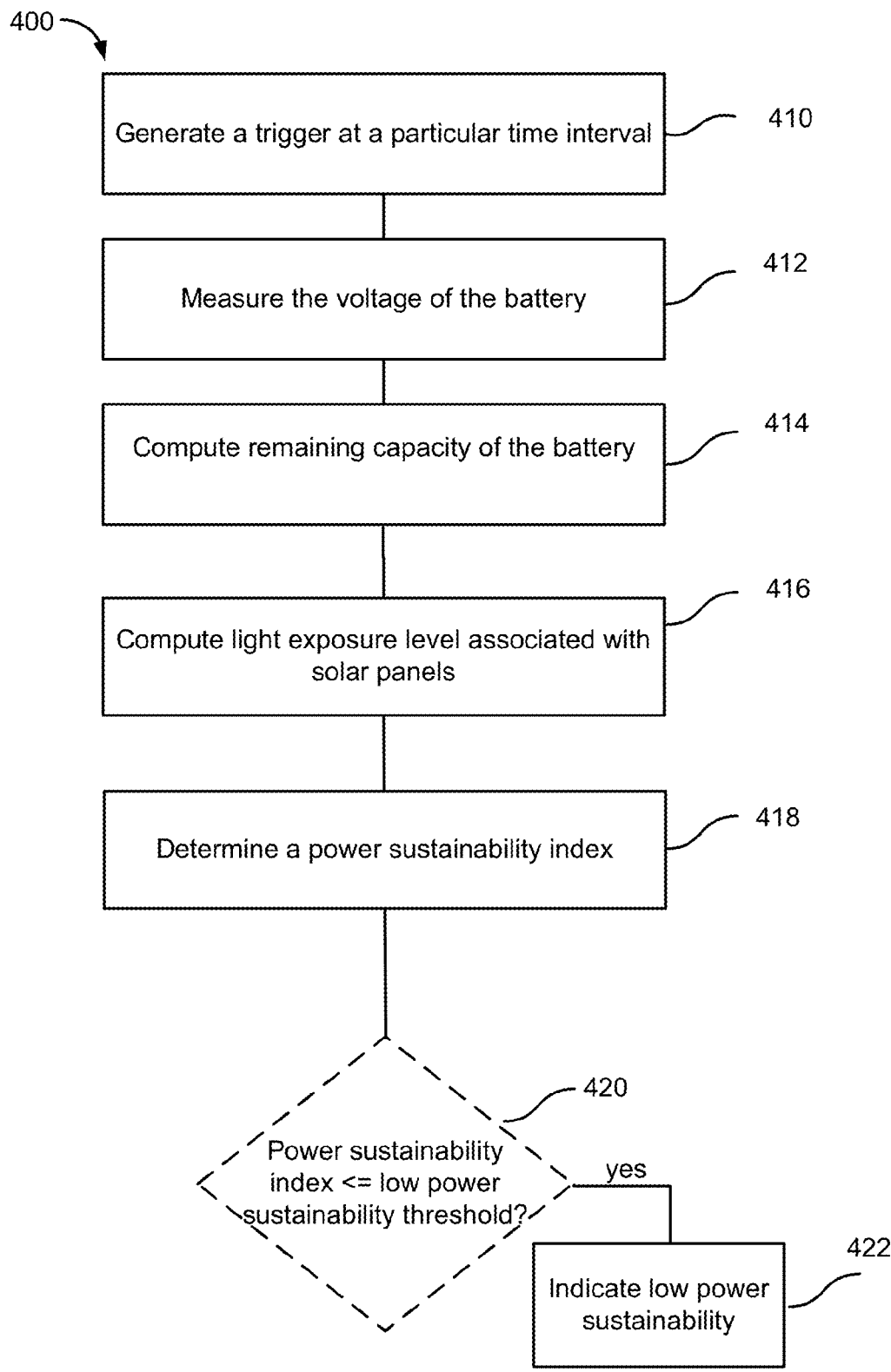
FIG. 4 is a simplified flowchart illustrating a method of monitoring power sustainability of a device according to an embodiment of the present invention.

FIG. 4 is a simplified flowchart illustrating a method of indicating a power sustainability status of a device having a processor, a timer, one or more solar panels, and a battery according to an embodiment of the present invention. The method includes generating, using the timer, a trigger at a particular time interval (410). The timer may be generated periodically after a certain time interval such as every two minutes, at pre-determined times such as on the quarter hour, at random times selecting within a range of time intervals, or the like. The method further includes, in response to at least the trigger measuring a voltage of the battery (412), computing, in the processor, a remaining capacity of the battery (414) using the voltage of the battery, and computing, in the processor, a light exposure level associated with the one or more solar panels (416). Also, the method includes determining a power sustainability index (418) using at least one of the remaining capacity of the battery or the light exposure level, optionally determining that the power sustainability index is less than or equal to (i.e., below or at) a first low power sustainability threshold (420), and providing an indication that a power sustainability status of the device is in a low power sustainability state (422). The first low power sustainability threshold is an index value below which a warning may be issued that current usage cannot be sustained. If the index is greater than the first low power sustainability threshold, then the user may not be interrupted with an unrequested status report.

It should be appreciated that the specific steps illustrated in FIG. 4 provide a particular method of indicating a power sustainability status of a device having a processor, a timer, one or more solar panels, and a battery according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

There may be a number of ways that power status information may be presented to the user. In an embodiment, status may be presented through power status indicator unit 120 on the keyboard that may comprise a plurality of LEDs. Each LED may correspond to a distinct power sustainability status, and the power status indicator unit 120 may illuminate the LED that corresponds to the present status of electronic keyboard 100. Illuminating the LED may comprising flashing the LED or turning on and sustaining the illumination for some time period. For example, power status indicator unit 120 may comprise two LEDs: one LED corresponding to a sufficient power sustainability status and the other LED corresponding to low power sustainability status. The plurality of LEDs may each be labeled to indicate the status represented by the LED. In an embodiment, distinct LED colors are used to distinguish the power sustainability status represented by the LED. For example, a green LED may be used to indicate sufficient power sustainability status and a red LED may be used to indicate low power sustainability status. An LED representing sufficient power sustainability status may be labeled with a positive indication such as a smiley face icon, a thumbs up icon, or a word synonymous with "good" or "sufficient". Likewise, an LED representing low power sustainability status may be labeled with a negative indication such as a frowning face icon, a thumbs down icon, or a word synonymous with "bad" or "insufficient." In an alternate embodiment, power status indicator unit 120 may be a display provided on keyboard 100, and power sustainability status presented through the keyboard display.

Each way of triggering power sustainability computation module 140 may be associated with one or more ways of providing status information to the user. For example, transitioning a power switch from an off to an on position may flash an LED on the keyboard to indicate present remaining battery capacity status (without using the light exposure level). Another example is that when a user presses a button on the keyboard, an LED on the keyboard may flash to indicate overall power sustainability status, which considers both remaining battery capacity and the light exposure level.

In addition, in an embodiment, monitoring power sustainability status in response to a trigger from timer 170 may only present status to warn of a low sustainability status. For example, the LED corresponding to a low sustainability status may flash repeatedly. In an embodiment, an LED may flash ten times. There may be no user presentation when the status is sufficient in order to minimize user distraction when no change to the available light is needed, increasing the probability that the user will notice when there is a low power sustainability status. In an embodiment, when power sustainability computation module 140 determines that the power sustainability status is critically low, the keyboard may respond in one or more ways including, for example, the performance of the keyboard may degrade (longer delay between hitting a key and the appearance of character data on the computer display), the keyboard may stop sending character data to the computer, the LED associated with low sustainability may flash each time the user presses a key, may be illuminated continuously, or may flash at a certain frequency. In an embodiment, the frequency of flashing the LED may vary depending on the battery voltage.

A power management application (may be referred to herein as "the application") may run on the computer (e.g., processor 180) to which the keyboard sends character data. In an embodiment, power sustainability status may be presented on display 185. A power management application running on processor 180 may receive power status information from the keyboard and provide the user with current status, historical trend information, and feedback on the lighting conditions and recommendations for repositioning the keyboard if necessary.

Whenever power sustainability computation module 140 generates a new set of power sustainability data, the data may be sent from the keyboard to processor 180 and received by the application. The keyboard may determine when to send data and when not to send data to the processor. Sending the data requires power, so sending data too often may deplete the very power that is being measured. In addition, sending data when the keyboard is idle may waste power as the user might not be present to view the status. Also, since the battery voltage measurements may be noisy, several battery voltage measurements may be averaged together, and a single aggregate remaining battery capacity sent to processor 180 less frequently than at each and every battery voltage measurement. Thus, power sustainability averages may be sent to the application when the keyboard is in active use. In an embodiment, power sustainability data may be sent within a particular time interval after character data is delivered to the processor. For example, power sustainability data may only be sent to the processor within two minutes of character data sent to the processor. In an embodiment, after two minutes of inactivity, the keyboard may become completely idle, and may no longer proactively monitor the power sustainability status until the next keystroke.

The data received from the keyboard may be any combination of battery voltage, a remaining battery capacity, a light intensity level, a power sustainability index, and/or averages thereof. The battery capacity and light intensity level may be expressed in any way known to persons of ordinary skill in the art. For example, remaining battery capacity may be expressed as a percentage of the full battery, and the light intensity level may be expressed as a lux value. The power sustainability index may be a number within a particular range of numbers. For example, within a range of 0 representing completely no power and 100 representing completely full power, a power sustainability index of 90 may indicate excellent sustainability.

Figure 5:
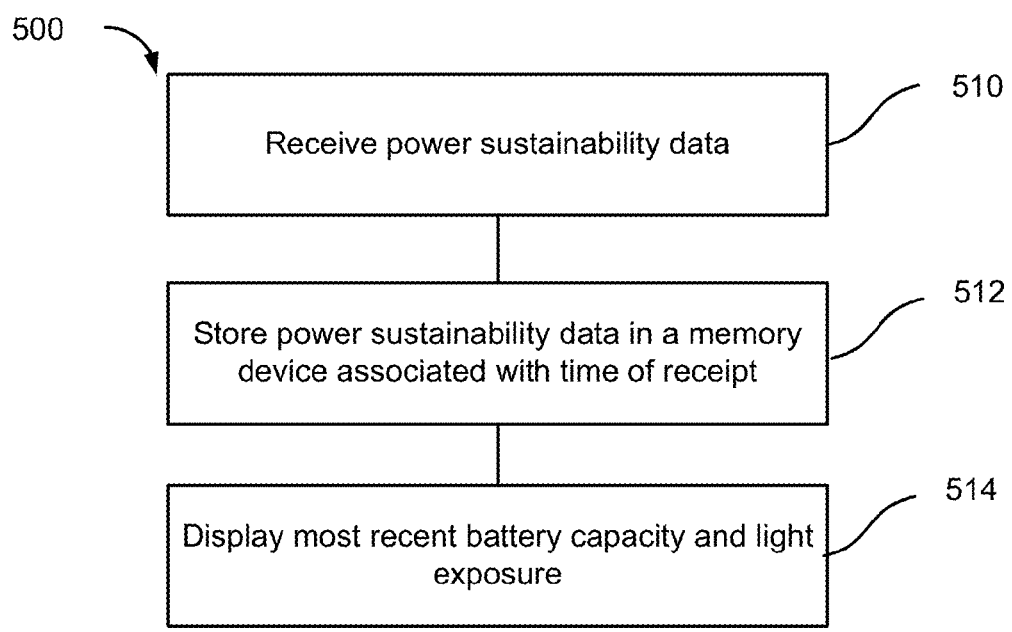
FIG. 5 is a simplified flowchart illustrating a method of receiving and storing power sustainability data according to an embodiment of the present invention.
Figure 6:
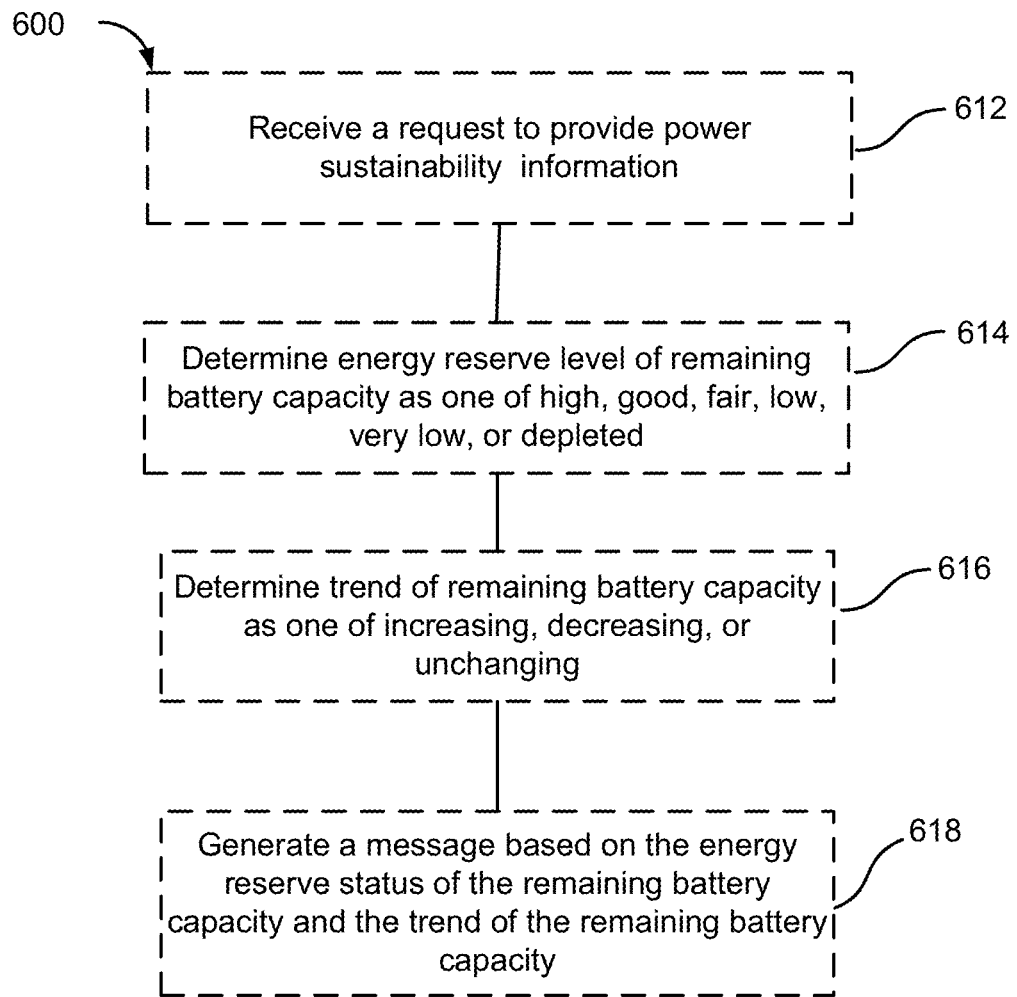
FIG. 6 is a simplified flowchart illustrating a method of displaying information regarding the power sustainability of a device according to an embodiment of the present invention.

FIG. 5 and FIG. 6 are simplified flowcharts illustrating a method for displaying power sustainability data for a battery according to an embodiment of the present invention. Referring to FIG. 5, the method includes providing a processor and a memory device coupled to the processor and receiving power sustainability data at a plurality of times (510), the power sustainability data comprising a remaining battery capacity and a light exposure level. In an embodiment, the computer (such as processor 180) receives from the keyboard, data regarding the power sustainability status of the keyboard. The method further includes storing data values in the memory device, the data values associated with the power sustainability data and the plurality of times (512). For example, a power management application running on the computer accepts the power sustainability data as input, and may store each data point in the input with a timestamp corresponding to the time the data was received by the processor for later retrieval and analysis. Alternatively, the timestamp may be generated by the keyboard and received by the processor together with the power sustainability data. The data may be stored in any kind of volatile or non-volatile memory/storage device. Additionally, the method includes displaying the most recently received data values for remaining battery capacity and light exposure levels (514)

Referring to FIG. 6, the method includes optional steps of receiving a request to provide power sustainability information (612). The method further includes optional steps for determining, using the processor, an energy reserve level of the remaining battery capacity characterized as at least one of high, good, fair, low, very low, or depleted (614) and determining, using the processor, a trend of the remaining battery capacity characterized as at least one of increasing, decreasing, or unchanging (616). Also, the method includes an optional step for generating a message using the energy reserve status of the remaining battery capacity and the trend of the remaining battery capacity and providing the message on a display device (618).

It should be appreciated that the specific steps illustrated in FIG. 5 and FIG. 6 provide a particular method for displaying power sustainability data for a battery according to an embodiment of the present invention. Other sequences of steps may also be performed according to alternative embodiments. For example, alternative embodiments of the present invention may perform the steps outlined above in a different order. Moreover, the individual steps illustrated in FIG. 5 and FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

As explained above, the application may receive data from the keyboard periodically and store the data for later use. However, in some embodiments, the data is only displayed upon certain events. In an embodiment, the incoming data may be analyzed by the power management application upon receipt, and the application may display a warning if the remaining battery capacity is determined to be critically low. Thus, embodiments can present power status information via the display.

In addition to requesting a power status indication from the keyboard itself, pressing the keyboard Check Light button may additionally cause processor 180 to launch the power management application to display power status information on display 185.

In another embodiment, the application may be launched to display status through a user interface provided by processor 180. The application may provide a single status snapshot or may provide a dynamic status window that is updated as new data is received.

In an embodiment, when the keyboard disables sending character data to the computer because of critically low power sustainability, the keyboard may send an indication to the computer that the keyboard is disabled. In response to receiving such an indication, the computer may launch the power management application to warn the user of the low power status and to provide instructions regarding necessary action to preserve sustainability of the power.

In an embodiment, each time the application receives a set of power sustainability data, the received data may be stored with a timestamp and used to determine a historical trend over a time period. The time period may be any practical time period such as minutes, hours, day, weeks, or months. The historical trend time period may be selected as described below. In another embodiment, multiple data sets may be received within a certain time period and averaged together, and the average data values may be stored with a timestamp. For example, the power management application may receive data every 90 seconds from the keyboard, but the application may average together the data received over a ten minute interval, and one set of data may be stored for each ten minute interval that is comprised of the average of the data received during the interval. In an alternate embodiment, a running average of remaining battery capacity values received during the last day, week, or month window may be stored.

Upon receiving a request to display status information to the user, the power management application may retrieve and display the data stored in memory. The most recent data may be displayed to represent the present status. For example, current remaining battery capacity may be displayed and/or current light exposure levels may be displayed. In addition or alternatively, a trend may be plotted and displayed as a graph of historical data over time. The historical remaining battery capacity values over time may be displayed as a graph for a selected historical time interval, and similarly, light exposure levels may be plotted and displayed as a graph over a selected historical time interval. The historical trends may alternatively be represented and displayed as a chart, textual data, or any other way of displaying a historical trend.

Figure 7:
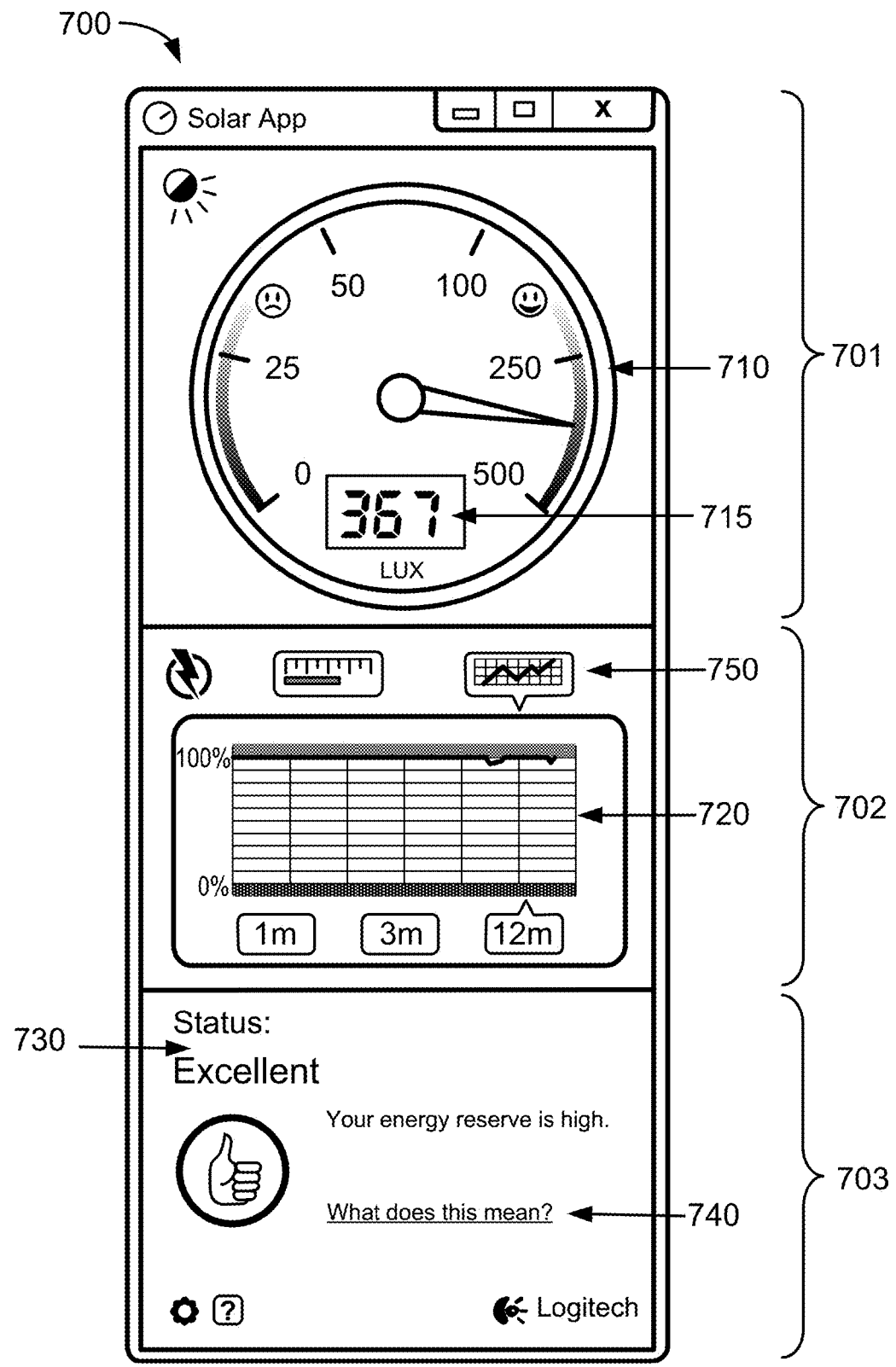
FIG. 7 and FIG. 8 are exemplary screen shots displayed by the power management application according to an embodiment of the present invention.
Figure 8:
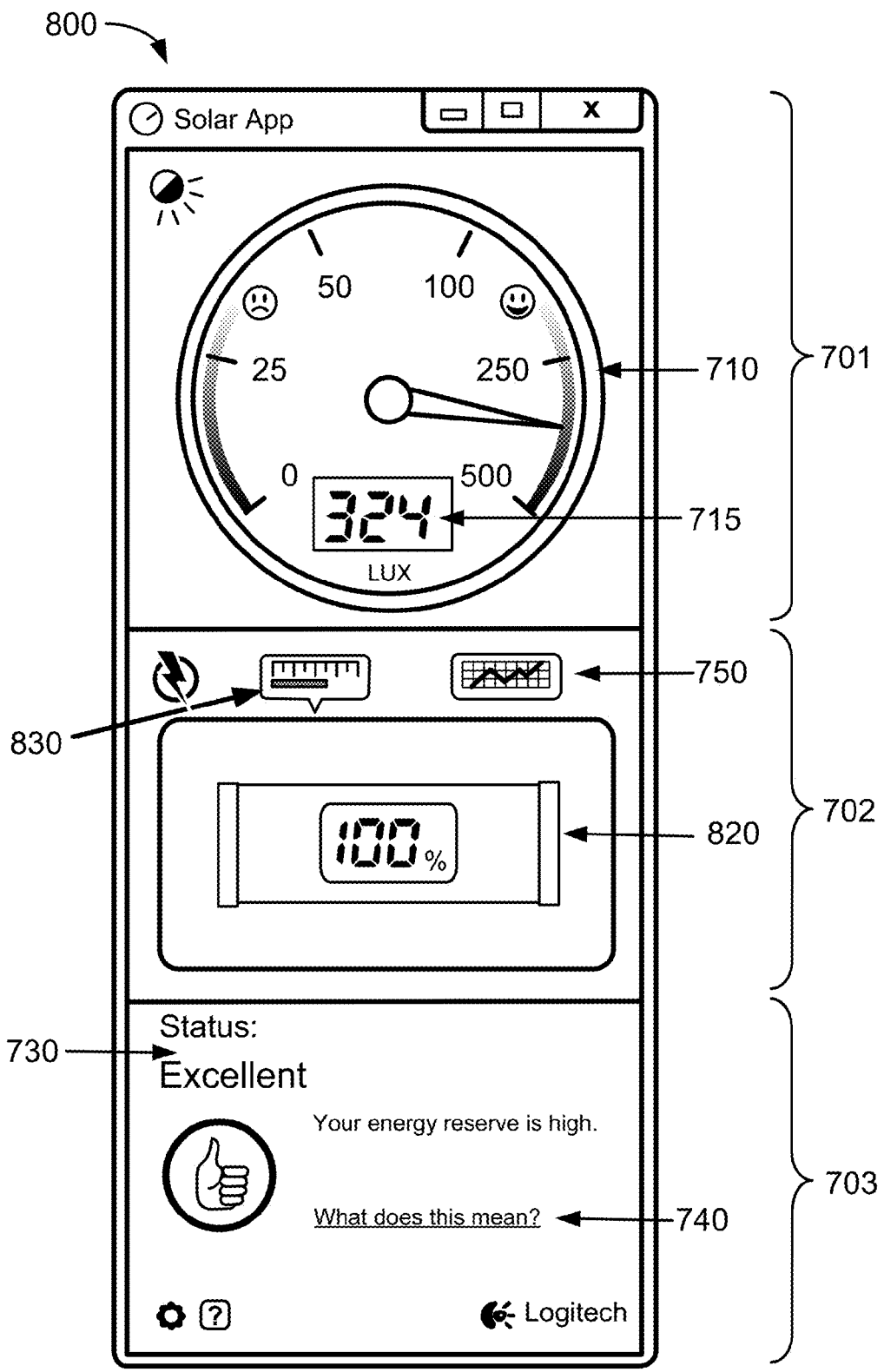

FIG. 7 and FIG. 8 are exemplary screen shots displayed by the power management application according to an embodiment of the present invention. A graphical user interface 700 is provided as illustrated in FIG. 7. The graphical user interface (GIU) includes a plurality of sections useful to display information to a user of the solar keyboard. The GUI includes a first section, which can be referred to as a light level indicator pane 701. In the illustrated embodiment, the light level indicator pane 701 is marked by an icon of the sun in the top left corner of this section. The GUI also includes a battery information pane 702, which can be used to indicate the remaining battery capacity as well as the history of the remaining battery capacity as a function of time. In FIG. 7, the battery information pane 702, which is marked by a lightning bolt in the top left corner, is used to indicate the history of the remaining battery capacity. In FIG. 8, the battery information pane 702 is used to indicate the remaining battery capacity at a given time. The GUI further includes a status message pane 703 that is useful in communicating messages to the user. Multiple messages can be displayed in the status message section at a given time.

In the embodiment illustrated in FIG. 7, the light level indicator pane 701 includes a dial 710 that displays the present light intensity level being received by the solar panels. The most recently received light intensity value is shown. Although a generally circular dial is illustrated in FIG. 7, this particular numerical range indicator is not required by embodiments of the present invention, and other range indicators, including linear or logarithmic scales, can be utilized according to an embodiment of the present invention. Inside dial 710 is a digital (numeric) representation of the light intensity level expressed in lux (715). In implementations utilizing linear scales, the digital representation can be placed below, above, or adjacent to the linear scale as appropriate to the particular application. One of ordinary skill in the art would recognize many variations, modifications, and alternatives.

The GUI also includes a pane operable to provide information related to the remaining battery capacity. When trend chart indicator 750 is highlighted, trend chart 720 shows the historical trend of remaining battery capacity data over a number of months. For example, when 12M is highlighted in trend chart 720, the trend data may be shown for the past year. When 3M is highlighted, data may be shown over the last quarter, and when 1M is highlighted, only data collected over the past month may be displayed in the trend chart. In other embodiments, other time periods such as days, weeks, multiple weeks, or other suitable time periods can be utilized, and the examples provided herein are merely exemplary. Alternatively, as shown in FIG. 8, when the present remaining battery capacity indicator 830 is highlighted, then the current remaining battery capacity is displayed. In the example shown in FIG. 8, the remaining battery capacity is 100%.

Status message 730 provides a summary status to the user indicating the current power sustainability level and providing recommended changes if the status is not favorable. The summary status message may be determined using trend information, such as whether remaining battery capacity or light exposure level is increasing, decreasing, or staying the same. The status message 730 may include words, symbols, graphics, and the like. In the example shown in FIG. 7, status message 730 informs the user that the current power status is Excellent and the energy reserve is high. The "What does it mean?" link 740 is a link to more detailed information and recommendations. For example, clicking on the "What does it mean?" link may display the following message:

"You've got plenty of juice right now. Your current reserve lets you use your keyboard in total darkness for four months—so you can type all you want. Want to keep your energy reserve high? Expose your keyboard to enough sunlight or indoor light even when you're not using it. (Don't worry—it recharges with light when it's switched off.) Your best bet is to keep your keyboard no more than 9 feet (3 meters) from a window with direct line of sight."

In an embodiment, the present remaining battery capacity is compared to a set of thresholds defining ranges of battery status. Table 2 shows the thresholds for the ranges and the corresponding status.

TABLE 2

Power State Ranges

| Minimum threshold (%) | Maximum threshold (%) | Energy Reserve Status |
|---|---|---|
| 90 | 100 | High |
| 80 | 90 | Good |
| 30 | 80 | Fair |
| 10 | 30 | Low |
| >0 | 10 | Very Low |
| 0 | 0 | Depleted |

As described herein, the power management application displays a plurality of status messages including "Need more light" and "Excellent." Additionally, when the remaining battery capacity is in a predetermined range (e.g., less than 30%), an indication can be provided to the user, for example blinking the red LED, and/or a message can be displayed, for example, "Warning! Your keyboard might stop working soon." In some implementations in which the computed remaining battery capacity reaches zero, some or all of the functionality of the keyboard may be disabled until sufficient light is provided (e.g., >300 lux). In some embodiments, if there is enough light to continue working and the keyboard is still being utilized (i.e., the keyboard is not in an idle state), the energy budget trend is still negative and more light will be needed to compensate for the keystrokes being entered by the user. In this event, the keyboard operation may be terminated through the use of an automatic hardware shutdown procedure. Subsequently, the keyboard operation will be terminated until the remaining battery capacity returns to predetermined levels. For example, a remaining battery capacity of 90% or greater may be considered a High energy reserve status, whereas a remaining battery capacity of greater than 30% and less than or equal to 80% may be considered a Fair energy reserve status. A battery state of 0% may be considered critically low or depleted.

Figure 10:
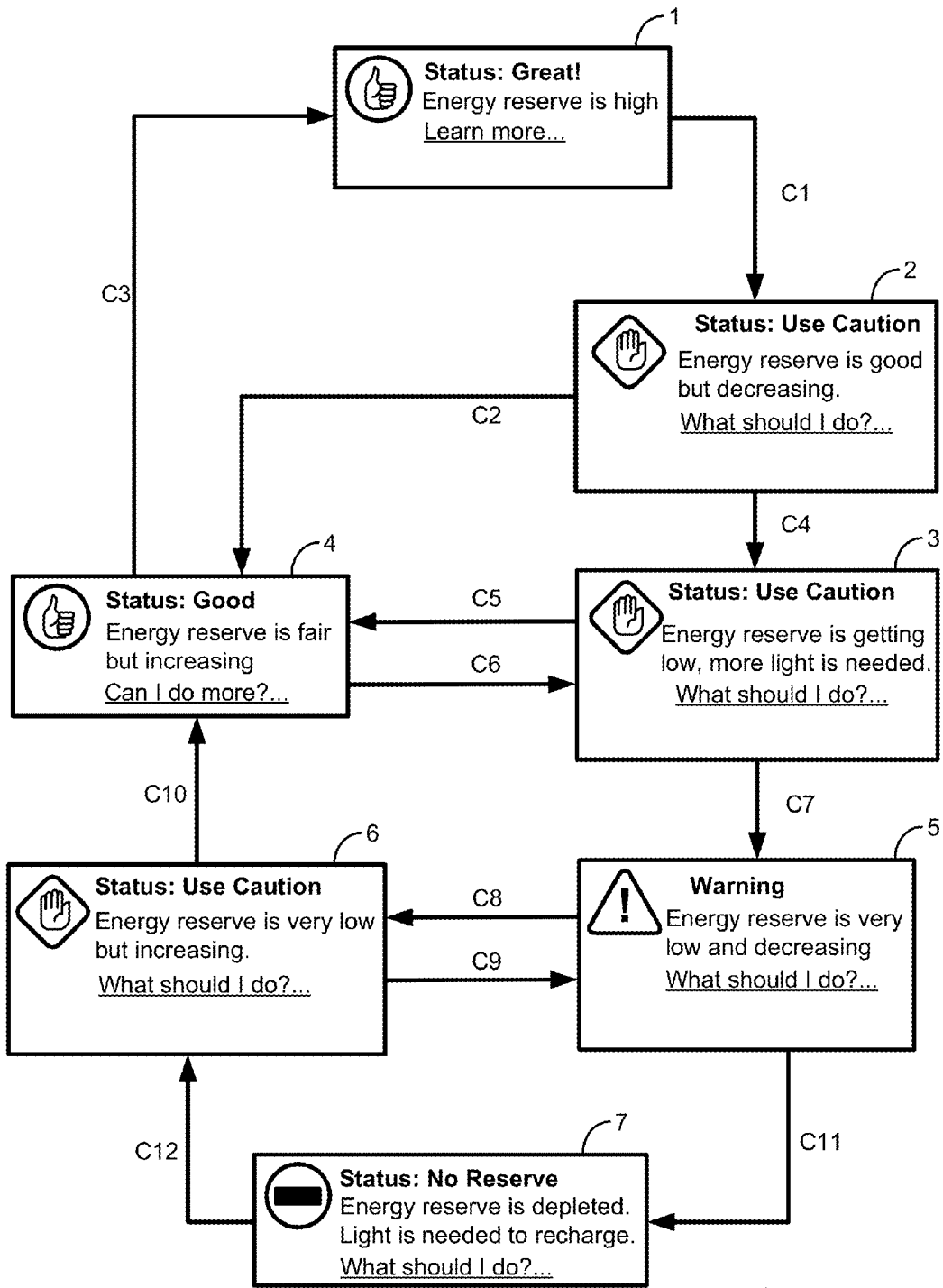
FIG. 10 is a simplified state diagram illustrating operation of the solar keyboard according to an embodiment of the present invention.

FIG. 10 is a simplified state diagram illustrating operation of the solar keyboard according to an embodiment of the present invention. The boxes labeled 1-7 represent power sustainability states. Each box 1-7 shows an example of the content that may be displayed in status message pane 703 when the keyboard is determined to be in the corresponding state. Arrows labeled {C1, C2, C3 . . . C12} indicate state transitions. In an embodiment, determining the current state depends on the remaining battery capacity level and light exposure level at the most recent snapshot in time and trend information over a time interval in addition to the previously determined state. In an alternative embodiment, determining the current state may be performed independent of the previous state. Regardless of whether previous state is used to determine current state, the arrows {C2, C3 . . . C12} indicate an expected sequence of states.

The statuses shown in Table 2 are based on the most recent remaining battery capacity data point. That is, the energy reserve status represents the present status in the embodiment illustrated in Table 2. The message provided to the user, however, may consider historical data. For example, the message that may be generated when the energy reserve status is in the Fair state when the battery capacity trend is decreasing may be:

Status: Needs more light
Your energy reserve is getting low.
What should I do?
It looks like your keyboard isn't getting enough light. Its energy reserves are low and getting lower as you use it. Fortunately, that's easy to fix. Just expose your keyboard to more light—and make sure it's exposed to light when you're not using it, too. Note: it will take several days for the status to be updated.
Need help figuring out if it's getting enough light? Press the CheckLight button on your keyboard and check that the lux gauge indicates 100 lux or more. If not, try moving your keyboard closer to a window or light source.

The message generated when the energy reserve status is Fair and the battery capacity trend is increasing may be:
Status: Good
Your energy reserve is fair but increasing.

In addition, the trend of the light exposure may also affect the generated message. For example, when the energy reserve status is Fair, the battery capacity is decreasing, but the light exposure level is increasing, the message may be:
Status: Light has improved
Energy reserve is still low however.
What should I do?
Your keyboard reserve is still low but it appears that the light intensity it receives has recently increased. However it will take several days for this to have a measurable effect on the energy reserve. We will tell you as soon as we detect this. In the meanwhile, try to keep or even increase this level of light if possible, even when you are not using your keyboard. Like a green plant.

Therefore, in some embodiments, the messages can be modified based on the trend of the keyboard usage and light intensity. Thus, embodiments of the present invention are not limited to the particular order of message delivery discussed above, but can be modified based on the particular implementation. One of ordinary skill in the art would recognize many variations, modifications, and alternatives.

Embodiments of the present invention provide feedback through both the power status indicator unit 120 and/or the power management application 700. The power management application enables users to evaluate their surroundings and adjust the light exposure level based on their usage and/or the drain on the battery. Thus, embodiments of the present invention provide for many different scenarios that provide a user with a solar powered device that is reliable, which is important in implementations in which the solar keyboard is the user's only input source for the user's computer. Thus, embodiments of the present invention overcome many of the obstacles previously presented in relation to solar keyboards.

As will be understood by those of skill in the art, the present invention may be embodied in other specific forms without departing from the essential characteristics thereof. Accordingly, the foregoing description is intended to be illustrative, but not limiting, of the scope of the invention which is set forth in the following claims. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of indicating a power sustainability status of a device having a processor, a timer, one or more solar panels, and a battery, the method comprising:
generating, using the timer, a trigger at a particular time interval; and
in response to at least the trigger:
measuring a voltage of the battery;
computing, by the processor, a remaining capacity of the battery using the voltage of the battery;
computing, by the processor, a light exposure level associated with the one or more solar panels;
determining a power sustainability index using at least one of the remaining capacity of the battery or the light exposure level;
determining the power sustainability status based on the power sustainability index; and
providing an indication of low power sustainability status,
wherein when the power sustainability index is determined to be less than or equal to a first low power sustainability threshold, providing an indication that the power sustainability status of the device is in a low sustainability state, and
wherein when the power sustainability index is determined to be less than or equal to a second low power sustainability threshold that is less than the first low sustainability threshold, disabling transmission of character data to an external processor device.

2. The method of claim 1 wherein the device comprises a keyboard operable to send to the external processor device character data produced in response to keystrokes, the method further comprising:
sending the power sustainability data over a network to the external processor device;
wherein the power sustainability data comprises at least one of the remaining battery capacity, the light exposure level, or the power sustainability index.

3. The method of claim 2 further comprising:
determining an average remaining battery capacity using a plurality of remaining data determined over a first averaging time interval; or
determining an average light exposure level using a plurality of light exposure level data determined over a second averaging time interval;
wherein the power sustainability data comprises at least one of the average remaining battery capacity or the average light exposure level;
wherein the first averaging time interval is not the same as the second averaging time interval.

4. The method of claim 2 wherein the power sustainability data is only sent to the external processor device within an activity time interval after character data is sent to the external processor device.

5. The method of claim 1 wherein the particular time interval comprises a value in a range between one minute and two minutes.

6. The method of claim 1 wherein the keyboard comprises an on/off switch operable to transition from a first position to a second position, the method further comprising:
   detecting a transition from the first position to the second position;
   determining an indication of the power sustainability status of the keyboard; and
   providing an indication of the power sustainability status of the keyboard.

7. A solar keyboard comprising:
   a housing;
   a keystroke input module disposed in the housing and operable to provide character data to a processor device;
   a battery disposed in the housing;
   one or more solar panels disposed on the housing;
   a power sustainability computation module operable to:
      measure a voltage of the battery;
      determine a usage level of the device and a low power sustainability threshold;
      compute a remaining capacity of the battery using the voltage of the battery and usage level of the device;
      compute a light exposure level associated with the one or more solar panels;
      determine a power sustainability index using at least one of the remaining capacity of the battery or the light exposure level; and
      compare the power sustainability index to the low power sustainability threshold;
   a power status input device; and
   a power status indicator unit.

8. The solar keyboard of claim 7 wherein the keystroke input module comprises a QWERTY keyboard.

9. The solar keyboard of claim 7 wherein the power status input device comprises a button.

10. The solar keyboard of claim 7 wherein the power sustainability computation module is enabled to determine a power sustainability status.

11. The solar keyboard of claim 7 wherein the power status indicator unit comprises a first LED and a second LED.

12. The solar keyboard of claim 7 further comprising an on/off switch operable to transition from a first position to a second position.

13. The solar keyboard of claim 7 wherein the one or more solar panels comprise two solar panels operable to receive light incident on an upper surface of the solar keyboard.

* * * * *